US008726811B2

(12) United States Patent
Kobayashi

(10) Patent No.: US 8,726,811 B2
(45) Date of Patent: May 20, 2014

(54) OVERHEAD TRANSPORT VEHICLE

(75) Inventor: Makoto Kobayashi, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 13/985,542

(22) PCT Filed: Dec. 8, 2011

(86) PCT No.: PCT/JP2011/078410
§ 371 (c)(1),
(2), (4) Date: Oct. 22, 2013

(87) PCT Pub. No.: WO2012/111221
PCT Pub. Date: Aug. 23, 2012

(65) Prior Publication Data
US 2014/0047995 A1 Feb. 20, 2014

(30) Foreign Application Priority Data
Feb. 15, 2011 (JP) .................................. 2011-029674

(51) Int. Cl.
B61B 3/00 (2006.01)
(52) U.S. Cl.
USPC .............................. 104/89; 105/150; 414/282
(58) Field of Classification Search
CPC ... H01L 21/67; H01L 21/677; H01L 21/6773; H01L 21/67733; H01L 21/67736; H01L 21/67715
USPC ...................................... 104/89–95
See application file for complete search history.

(56) References Cited

U.S. PATENT DOCUMENTS

| 7,437,999 | B2* | 10/2008 | Nakao | 104/106 |
| 7,461,598 | B2* | 12/2008 | Shiwaku | 104/88.01 |
| 7,578,240 | B2* | 8/2009 | Shiwaku | 104/89 |
| 7,735,424 | B2* | 6/2010 | Nakashima et al. | 104/89 |
| 7,753,639 | B2* | 7/2010 | Hoshino | 414/282 |
| 7,972,104 | B2* | 7/2011 | Shiwaku et al. | 414/282 |
| 8,550,006 | B2* | 10/2013 | Wada | 104/89 |

(Continued)

FOREIGN PATENT DOCUMENTS

| JP | 50-3199 | 1/1975 |
| JP | 2003-165687 | 6/2003 |
| JP | 2006-168874 | 6/2006 |
| JP | 2009-40563 | 2/2009 |

OTHER PUBLICATIONS

Japanese language international preliminary report on patentability and its English language translation dated Aug. 29, 2013 issued in corresponding PCT application PCT/JP2011/078410.

Primary Examiner — Jason C Smith
(74) Attorney, Agent, or Firm — DLA Piper LLP (US)

(57) ABSTRACT

An overhead transport vehicle comprises a travelling unit that travels on a rail, a conveying unit that moves and conveys an article and a swing inhibiting member that moves between a pushing position and a retracting position. The swing inhibiting members includes a pushing member that pushes a side surface of the article, lever members that support the pushing member at a first end side and are pivotally supported by the conveying unit at a second end side, and a biasing member that biases the pushing member toward the article. The pushing member includes a main body member pivotally supported by the lever members, slide members slidably supported by a main body member, and elastic bodies arranged between the main body member and the slide member that slide elastically the slide member.

9 Claims, 12 Drawing Sheets

(56) References Cited

U.S. PATENT DOCUMENTS

| | | | |
|---|---|---|---|
| 8,591,163 B2* | 11/2013 | Toyoda et al. | 414/411 |
| 2004/0126208 A1* | 7/2004 | Tawyer et al. | 414/222.02 |
| 2004/0253087 A1* | 12/2004 | Iizuka | 414/626 |
| 2006/0072987 A1* | 4/2006 | Hoshino | 414/277 |
| 2006/0222479 A1* | 10/2006 | Shiwaku et al. | 414/267 |
| 2006/0230975 A1* | 10/2006 | Shiwaku | 104/88.01 |
| 2007/0163461 A1* | 7/2007 | Shiwaku | 104/89 |
| 2010/0239400 A1* | 9/2010 | Ishikawa | 414/373 |
| 2011/0188977 A1* | 8/2011 | Toyoda et al. | 414/411 |
| 2013/0177857 A1* | 7/2013 | Shibazaki | 430/325 |
| 2013/0213257 A1* | 8/2013 | Yamamoto et al. | 105/150 |
| 2014/0047995 A1* | 2/2014 | Kobayashi | 104/89 |

* cited by examiner

OVERHEAD TRANSPORT VEHICLE

CROSS REFERENCE TO RELATED APPLICATIONS

This application is a national stage of international application PCT/JP2011/078410, filed on Dec. 8, 2011, and claims the benefit of priority under 35 USC 119 of Japanese application 2011-029674, filed on Feb. 15, 2011, which are incorporated herein by reference.

TECHNICAL FIELD

This invention relates to an overhead transport vehicle, particularly to an overhead transport vehicle that conveys an article such as a container, etc. that contains various kinds of substrates and etc. for manufacturing a semiconductor equipment on a rail.

BACKGROUND ART

An overhead hoist vehicle (so-called OHT: Overhead Hoist Transport) is known as a conventional conveying vehicle. The overhead hoist vehicle conveys an article such as a FOUP (Front Opening Unified Pod) and etc. by travelling on a rail arranged on a ceiling. Such conveying vehicle may comprise a falling prevention member and a swing inhibiting member. The falling prevention member is configured to prevent the article from falling, by projecting under the transferred article. The swing inhibiting member is configured to rotate in conjunction with a movement of the falling prevention member and is configured to inhibit swing by pushing the article. For example, patent citation 1 discloses a mechanism that pushes an elastic body such as a gel and etc. with a linear movement mechanism, the linear movement mechanism working with the falling prevention member. On the other hand, patent citation 2 discloses a mechanism in which a pushing member is directly attached to the falling prevention member.

Patent Citation 1: Japanese Laid Open Patent Application No. 2009-040563
Patent Citation 2: Japanese Laid Open Patent Application No. 2003-165687

DISCLOSURE OF INVENTION

Technical Problem

However, the technique according to the above-mentioned patent citation 1 requires a larger space to arrange the linear movement mechanism, which may result in both making equipment larger and reducing space for arranging other members. In addition, since there is a gap between a pushing part of a roller and a part sliding linearly, the swing inhibiting member may be damaged.

Moreover, in the techniques according to patent citation 1 and patent citation 2, the article is restricted by an elastic force of the pushing member. In this case, since an amount of expansion and contraction of the pushing member is small, an acceptable amount of swing, of the article in a travelling direction and a direction crossing the travelling direction, becomes small. The vibrations generated in the conveying vehicles are easily transmitted to the article, thus, it is a technical problem in the techniques according to patent citation 1 and patent citation 2.

This invention is carried out in light of the above-described problem, and the problem to be solved is to provide a conveying vehicle and a conveying system that can effectively reduce the transmission of the swing and vibrations to the article.

Technical Solution

A conveying vehicle according to the present invention comprises a travelling unit, a conveying unit, and a swing inhibiting member. The travelling unit is configured to travel on a rail arranged on or near a ceiling. The conveying unit is attached to the travelling unit, and configured to both move an article into a containing space and convey the article. The swing inhibiting member is pivotally supported by the conveying unit. The swing inhibiting member is configured to move between a pushing position, and a retracting position. The pushing position is a position from which a side surface of the article is pushed. The retracting position is a position away from the pushing position enabling the swing inhibiting member to move the article into the containing space.

The swing inhibiting member includes a pushing member, a lever member, and a biasing member. The pushing member is configured to push the side surface of the article. A first end side of the lever member is configured to support the pushing member. A second end side of the lever member is pivotally supported by the conveying unit. The biasing member is arranged in the lever member, and is configured to bias the pushing member to the article.

The pushing member includes a main body member, a slide member, and elastic bodies. The main body member is pivotally supported by the lever member. The slide member includes a pushing surface to abut the article. The slide member is supported by the main body member so as to slide in a direction crossing a travelling direction of the conveying vehicle (a slide direction). The elastic bodies are configured to elastically slide the slide member. The elastic bodies are arranged between the main body member and the slide member.

The conveying vehicle according to the present invention comprises the travelling unit, configured to travel on the rail arranged on or near the ceiling, and the conveying unit, which is attached to the travelling unit. In this conveying vehicle, the conveying unit is configured to move the article into a containing space, and the travelling unit is configured to travel on the rail, thus, the article is conveyed. The conveying unit is typically attached to the travelling unit, and suspended from the travelling unit. The conveying unit includes a gripping member configured to grip the article, for example. When the conveying unit carries the article, the article gripped by the gripping member is moved into the containing space. The containing space is defined as an U-shaped inner space that is formed in the conveying unit and opened downwardly, for example.

The conveying vehicle according to the present invention comprises the swing inhibiting member. The swing inhibiting member is supported by the conveying unit. Specifically, the swing inhibiting member is supported by a lower end side of the conveying unit so as to rotate in a horizontal direction. It should be noted that "the lower end side" described here means a position low enough to push the article carried in the containing space from the side. It should also be noted that "the horizontal direction" means not only the direction completely horizontal but also covers a broader meaning such as a direction obliquely crossing the horizontal direction.

The swing inhibiting member is configured to move between the pushing position and the retracting position. Specifically, this swing inhibiting member is configured to move from the pushing position to the retracting position, and vice versa, by rotating in the horizontal direction. More specifically, when the article is about to be carried, the swing inhibiting member is in a state where at least part of the swing inhibiting member is retracted so as to make enough space for the article to pass the space in the vicinity of an entrance of the containing space. On the other hand, after carrying the article, the swing inhibiting member is configured to push the side surface of the article by projecting to the side of the containing space (namely, the side of the article contained), thus preventing the article from swinging. It should be noted that "swing" described here means a larger swing that is generated by a centrifugal force generated when the article, that is transported on the conveying vehicle, travels on a curve.

Specifically, the swing inhibiting member, according to the present invention, includes a pushing member, a lever member, and a biasing member. The pushing member is configured to push the side surface of the article. Specifically, the pushing member is configured to push, in a planar manner, the side surface of the article when the pushing member is at the pushing position. The lever member is configured to support the pushing member at the first end side. The second end side of the lever member is pivotally supported by the conveying unit. The biasing member is arranged in the lever member, and configured to bias the pushing member to the side of the article. The lever member is pivotally supported by the conveying unit. When the swing inhibiting member moves from the retracting position to the pushing position, the lever member rotates, and then the pushing member abuts the side surface of the article.

As described above, in the swing inhibiting member, according to the present invention, the pushing member abuts the side surface of the article due to the rotation of the lever member pivotally supported by the conveying member. Here, it is assumed that the pushing member abuts the side surface of the article due to a linear movement of the swing inhibiting member. In such a case, a large space in a travelling direction is required to arrange a linear movement mechanism. Therefore, in such a structure, equipment may become larger, and the space for arranging other members may be reduced. On the other hand, the swing inhibiting member according to the present invention allows the pushing member to abut the side surface of the article by the rotation of the lever member. As a result, the swing inhibiting member can preferably be retracted within an extremely small space. Therefore, downsizing of an equipment can be realized.

In addition, since the pushing member according to the present invention pushes the side surface of the article, the swing can reliably be inhibited even if the article swings in the direction crossing the pushing direction. For example, when the pushing member is configured to push the side surface of the article in a planar manner, and when the article swings in the direction crossing the pushing direction, the swing can reliably be inhibited. Moreover, the pushing member is configured to push the article, not only with the rotating force to the lever member, but also with the biasing force by the biasing member. With such a structure, since the pushing member can push the article while following the swing of the article, the swing of the article can be inhibited very effectively.

Moreover, according to the present invention, the above-described pushing member includes the above-described main body member, the above-described slide member, and the above-described elastic bodies. The slide member is supported by the main body member in a manner such that it can slide in the slide direction.

The main body member, pivotally supported by the lever member, enables an angle of a pushing surface to change, in accordance with an angle of the article, in the containing space. Therefore, the side surface of the article can be reliably pushed by the pushing surface. In addition, the slide member, slidably supported by the main body member, is able to absorb vibrations transmitted from the conveying vehicle, and to prevent transmission of the vibrations to the article. It should be noted that "vibration" described here means smaller swing generated in a travelling system of the conveying vehicle. The slide member is further configured to slide elastically by the elastic bodies. Therefore, the transmission of the vibrations to the article can reliably be inhibited.

As explained above, according to the overhead transport vehicle of the present invention, it is possible to effectively inhibit the transmission of vibrations, and swing of the article.

According to one aspect of the conveying vehicle of the present invention, in the pushing member, the main body member is formed in a block shape. The main body member includes a planar projecting plate portion projecting away from the pushing surface. The slide member includes a first and second longitudinal members, a lateral member, and a shaft member. The first and second longitudinal members are provided to the pushing surface and at both sides of the main body member with predetermined gaps from the main body member, respectively. The lateral member connects the first and second longitudinal members with each other, and is configured to support the projecting plate portion. The lateral member is configured to slide the projecting plate portion in the slide direction, and to avoid moving the projecting plate portion upward and downward. The shaft member is inserted into a through hole formed in the main body member. The shaft member is configured to slide relative to the main body member, and to connect the first and second longitudinal members with each other at a place between the pushing surface and the lateral member. The elastic bodies are arranged in the predetermined gap between the main body member and the first longitudinal member, and are disposed in the predetermined gap between the main body member and the second longitudinal member.

According to this aspect of the invention, in the pushing member, the main body member is formed in a block shape, and configured to include the planar projecting plate portion. The projecting plate portion is supported by the lateral member of the slide member so as to slide in the slide direction, and so as to not move upward and downward. In the slide member, for example, the first and second longitudinal members are arranged at both sides of the main body member with the predetermined gaps from the main body member, respectively, as the first and second longitudinal members project, from both sides in a width direction of the pushing surface (namely, both ends of the side), to the main body member. In addition, the lateral member is arranged so as to connect the first and second longitudinal members with each other at the edge. With such a structure, the pushing member can be downsized easily, and upward and downward (namely, the directions different from the slide direction) movements of the main body member can be avoided. Therefore, the conveying vehicle can be damage-resistant.

In addition, a pair of elastic bodies are arranged in the predetermined gap between the main body member and the first longitudinal member, and in the predetermined gap between the main body member and the second longitudinal member. In other words, the predetermined gap according to this aspect is arranged so that the gap is large enough to arrange a pair of the elastic bodies. A pair of the elastic bodies enables both the sliding to the first longitudinal member of the main body member, and the sliding to the second longitudinal member, to be preferably elastic sliding movements. Therefore, the transmission of vibrations to the article can effectively be inhibited.

According to another aspect of the conveying vehicle of the present invention, the lever member has a first lever member and a second lever member. A first end side of the first lever member is pivotally supported by the transport vehicle. A first end side of the second lever member is pivotally supported by a second end side of the first lever member. A second end side of the second lever member is configured to pivotally support the pushing member. The biasing member is arranged at a place where the first lever member and the second lever member are connected with each other. The biasing member is configured to bias the second lever member so as to align the first lever member and the second lever member in line. In addition, the lever member further includes a driving force transmitting unit configured to transmit a rotating force that rotates the first lever member to the article.

According to this aspect, a base end side (the first end side) of the first lever member is pivotally supported by the conveying unit. In addition, a base end side (the first end side) of the second lever member is pivotally supported by a tip side (the second end side) of the first lever member. Moreover, the pushing member is attached to a tip side (the second end side) of the second lever member. The biasing member is arranged at the place where the first lever member and the second lever member are connected with each other. The biasing member is formed, for example, as a torsional spring. This biasing member is configured to bias the second lever member so as to align the first lever member and the second lever member in line.

When the swing inhibiting member is in the retracting position, the first lever member and the second lever member are in a position where they are aligned in line. Therefore, the swing inhibiting member can be retracted in a compact size, and the downsizing of the swing inhibiting member can preferably be realized. On the other hand, when projecting the swing inhibiting member to the pushing position, the driving force transmitting unit first transmits the rotating force to the first lever member, and then the first lever member and the second lever member rotate relative to the conveying unit. This allows the pushing member to abut the article. After the pushing member abuts the article, the first lever member continues rotating in the same manner. In such a state, the second lever member is dogleg, relative to the first lever member, and the biasing force from the biasing member is applied to the first lever member and the second lever member. With such a structure, even if the article swings largely in the pushing direction of the pushing member, the pushing member can follow the movement of the article and keep pushing the side surface of the article. Therefore, the swing of the article can extremely effectively be stopped.

In the above-described structure comprising the driving force transmitting unit, it is acceptable to configure the conveying vehicle as follows. The conveying vehicle further comprises a falling prevention member. The falling prevention member is pivotally supported by the conveying unit under the swing inhibiting member so as to rotate. The falling prevention member is configured to project under the article in conjunction with a movement of the swing inhibiting member, from the retraction position to the pushing position, and prevent the article from falling from the containing space. The driving force transmitting unit includes a projecting unit and a force receiving guide. The projecting unit is arranged to the falling prevention member. The force receiving guide is arranged to the first lever member and configured to receive a force from the projecting unit.

In this case, because the falling prevention member is arranged at the lower end side of the conveying unit than the swing inhibiting member, the falling prevention member can prevent the article contained in the containing space from falling. Specifically, the falling prevention member moves to project under the article and works in conjunction with the movement of the swing inhibiting member moving from the retracting position to the pushing position. Thus, for example, it is possible to receive an article that is about to fall from the containing space, due to the swing of the conveying vehicle from the lower side of the containing space.

The projecting unit as the driving force transmitting unit is specially arranged to work with the above-described falling prevention member. On the other hand, the force receiving guide as the driving force transmitting unit is arranged to work with the first lever member of the swing inhibiting member. The force receiving guide is configured to convert the force received from the projecting unit, to the rotating force of the first lever member. Therefore, it is possible to couple the falling prevention member to the swing inhibiting member, and move the falling prevention member and the swing inhibiting member with an extremely simple structure.

It is acceptable in the above-described structure, in which the lever member includes the first lever member and the second lever member, for the biasing member to be a torsional spring. The torsional spring is attached to the first lever member at the first end side and is attached to the second lever member at the second end side.

In this case, since the first end side of the torsional spring is attached to the first lever member, and the second end side of the torsional spring is attached to the second lever member, it is possible to reliably generate the biasing force with which the first lever member and the second lever member utilize to align in line. In addition, since the torsional spring is low in cost and simple in structure, it is possible to avoid increasing the manufacturing cost and making the structure of the equipment complicated.

It is acceptable, in the above-described structure in which the biasing member is a torsional spring, for the first end side of the torsional spring to abut the first lever member via a buffering member, and for the second end side of the torsional spring to abut the second lever member, via a buffering member.

In this case, the buffering members are arranged between the torsional spring as the biasing member and the first lever member, and between the torsional spring and the second lever member. With such a buffering member, it is possible to extremely rapidly damp the swing, of the article pushed by the swing inhibiting member, in a biasing direction of the spring.

It is acceptable, in the above-described structure in which the lever member includes the first lever member and the second lever member, for the biasing member to be a plate spring. The plate spring is configured to abut the first lever member at the first end side, and configured to abut the second lever member at the second end side.

In this case, since the first end side of the plate spring abuts the first lever member, and the second end side of the plate spring abuts the second lever member, it is possible to reliably generate the biasing force with which the first lever member and the second lever member utilize to align in line. In addition, since the plate spring is low in cost and simple in structure, it is possible to avoid increasing the manufacturing cost and complicating the structure of the equipment.

It is acceptable in the above-described structure, in which the biasing member is a plate spring, for the first end side of the plate spring to abut the first lever member via a buffering member, and for the second end side of the plate spring to abut the second lever member, via a buffering member.

In this case, the buffering members are arranged between the plate spring as the biasing member and the first lever member, and between the plate spring and the second lever member. With such a buffering member, it is possible to extremely rapidly damp the swing, of the article pushed by the swing inhibiting member, in a biasing direction of the spring.

According to other aspect of the conveying vehicle of the present invention, the pushing member includes a third elastic body arranged on at least one part of the pushing surface.

In this structure, the third elastic body is arranged on at least one part of the pushing surface abutting the article. The third elastic body is different from the elastic body that enables the slide member to slide elastically. With the third elastic body, since it is possible to push elastically the article, it is possible to avoid scratches on, and damage to, the article. In addition, it is possible to reliably damp the swing of the conveyed vehicle, and to inhibit the transmission of the vibration of the article.

It should be noted that it is preferable that the third elastic body is arranged so as to cover the entire pushing surface. In addition, it is acceptable that third elastic body is arranged to the part other than the pushing surface.

Additional effects and merits of the invention will be clarified in the description of the embodiments that follow.

Advantageous Effects

According to the present invention, it is possible to provide a conveying vehicle, and a conveying system, that effectively reduce the transmission of swings and vibrations to the article.

EXPLANATION OF REFERENCE NUMERALS

Figure 1:
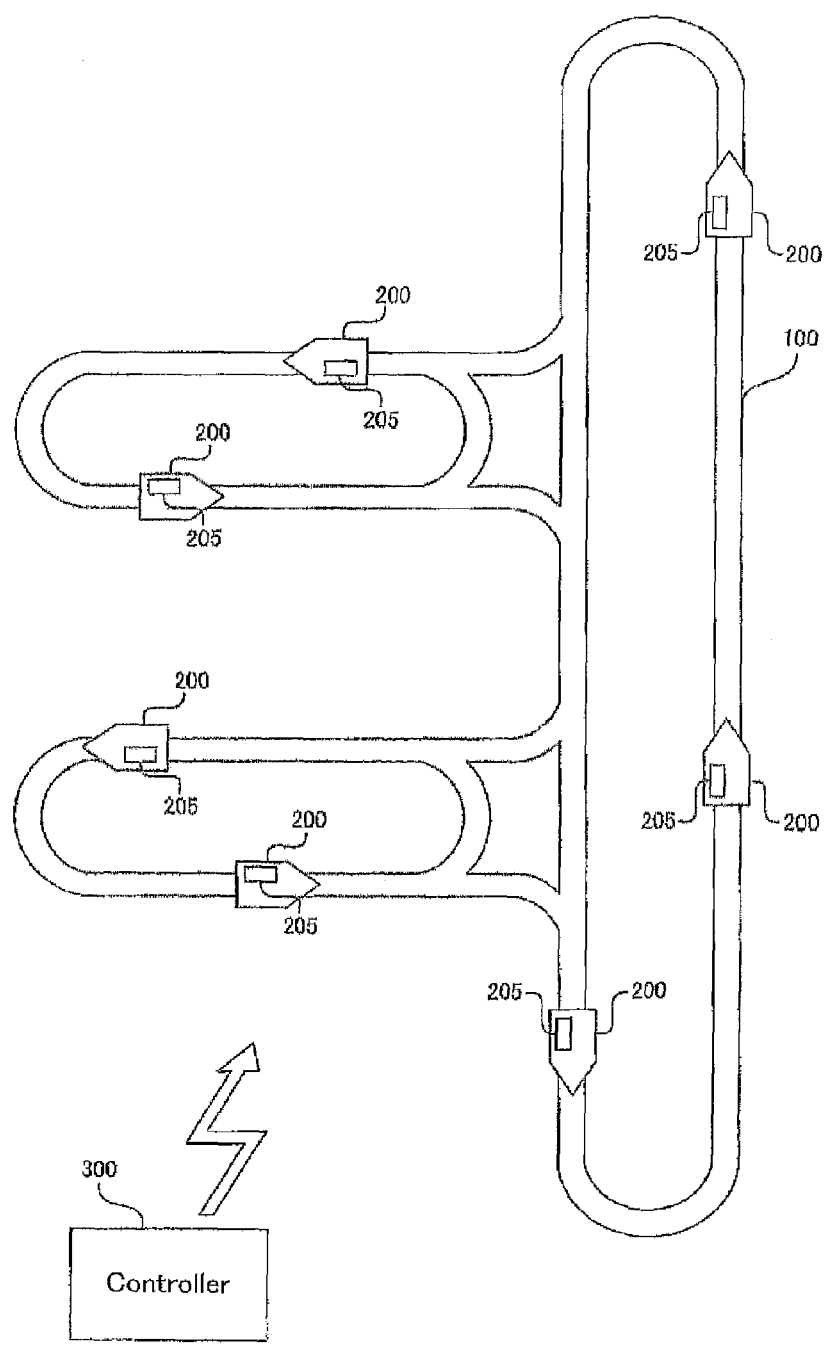
FIG. 1 is a top view showing an overall structure of a conveying system.

100 rail
200 vehicle
210 travelling unit
215 travelling roller
220 main body member
230 moving unit
240 hoisting belt
250 gripping unit
260 falling prevention member
265 roller
270 swing inhibiting member
271 first lever member
272 second lever member
273 pushing member
274 biasing member
275 roller guide
300 controller
400 FOUP
510 port
520 side buffer
710 pushing surface member
721 first longitudinal member
722 second longitudinal member
731 first lateral member
732 second lateral member
740 shaft
750 block member
751 projecting plate portion
761, 762 elastic body

EMBODIMENT

A preferred embodiment of the present invention will be explained below, referring to the figures.

First, an overall structure of a conveying system according to the present invention will be explained, referring to FIG. 1. The conveying system according to the present invention comprises a vehicle as one example of "an overhead transport vehicle". FIG. 1 is a top view showing the overall structure of the conveying system.

In FIG. 1, the conveying system according to this embodiment comprises a rail 100, vehicles 200, and a controller 300.

The rail 100 is arranged, for example, on a ceiling and made of metals such as aluminium, stainless steel, and etc.

A plurality of the vehicles 200 are arranged on the rail 100. Each vehicle 200 can convey a FOUP as an article by travelling along the rail 100.

In addition, each vehicle 200 has an onboard controller 205. The onboard controller 205 receives a conveying instruction from a controller 300 and controls the travelling of the vehicle 200. It should be noted that the onboard controller 205 controls not only the travelling of the vehicle 200 but also overall equipments included in the vehicle 200.

The controller 300 includes, for example, an arithmetic circuit, a memory, and etc. The controller 300 is configured to provide the conveying instruction to the vehicle 200 via the onboard controller 205.

It should be noted that, although not shown in the figure, a shelf that stores temporarily a FOUP (for example, a buffer, a port, and etc.) and a semiconductor manufacturing equipment are arranged along the rail 100.

Figure 2:
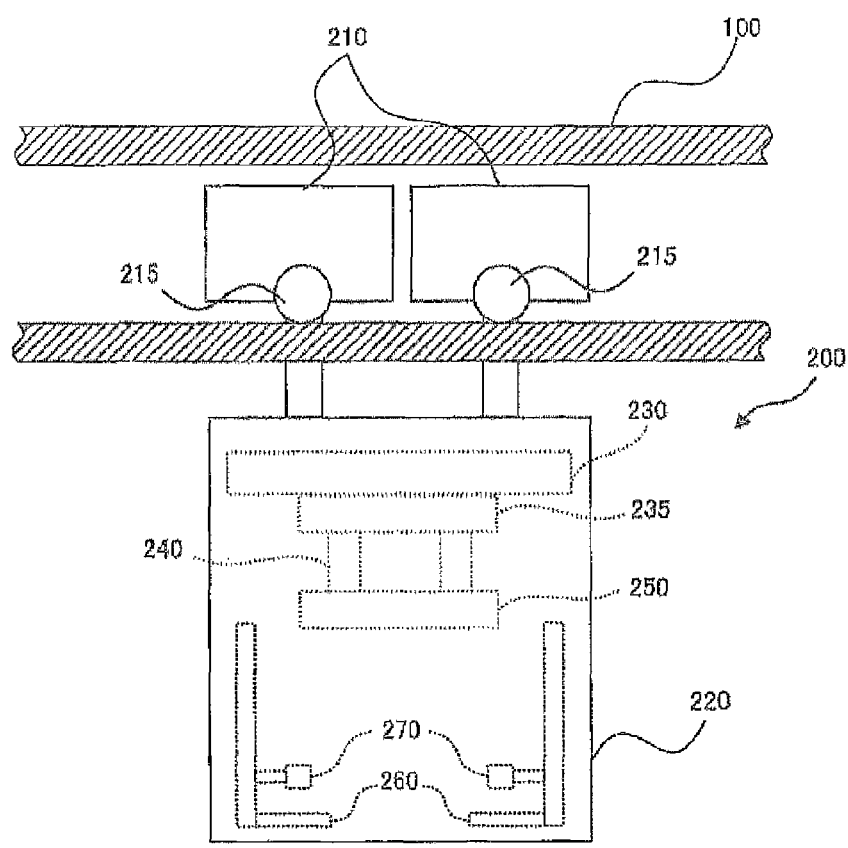
FIG. 2 is a side view showing a structure of a vehicle.

Next, the concrete structure of the vehicle 200 will be explained, referring to FIG. 2. FIG. 2 is a side view showing the structure of the vehicle.

In FIG. 2, the vehicle 200 includes travelling units 210, a main body member 220, a moving unit 230, a hoisting unit 235, a gripping unit 250, a falling prevention member 260, and a swing inhibiting member 270.

When a propulsion power is given to the travelling units 210 by, for example, a linear motor and etc., travelling rollers 215 roll and the vehicle 200 travels along the rail 100. On the lower surfaces of the travelling units 210, the main body member 220 as one example of "a conveying unit" of the present invention is suspended.

The moving unit 230 is attached to the main body member 220. The moving unit 230 can move to the sides of the rail 100 (namely, a vertical direction to the surface of paper in FIG. 2). On the lower surface of the moving unit 230, the hoisting unit 235 is attached.

On the lower surface of the hoisting unit 235, the gripping unit 250 configured to grip the FOUP is attached by a hoisting belt 240. The gripping unit 250 can descend or ascend by winding off the hoisting belt 240 or reeling the hoisting belt 240.

The falling prevention members 260 are arranged in the vicinity of a lower end of the main body member 220. The falling prevention members 260 are configured to prevent the FOUP from falling by projecting so as to support the carried FOUP at the lower side of the FOUP.

The swing inhibiting members 270 are arranged at the position higher than the above-described falling prevention members 260 in the main body member 220. The swing inhibiting members 270 are configured to inhibit the swing by pushing the side surface of the carried FOUP.

The concrete structures and operations of the falling prevention members 260 and the swing inhibiting members 270 will be described in detail later.

Figure 3:
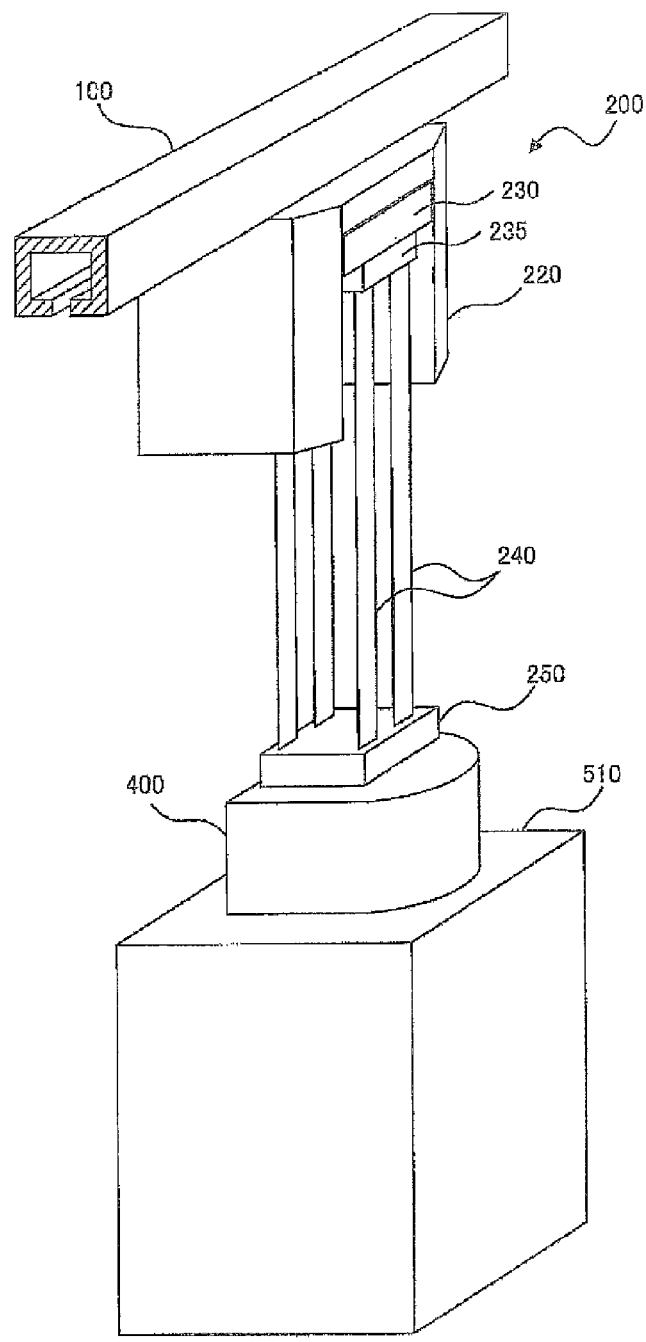
FIG. 3 is a perspective view showing a transferring operation of a vehicle.
Figure 4:
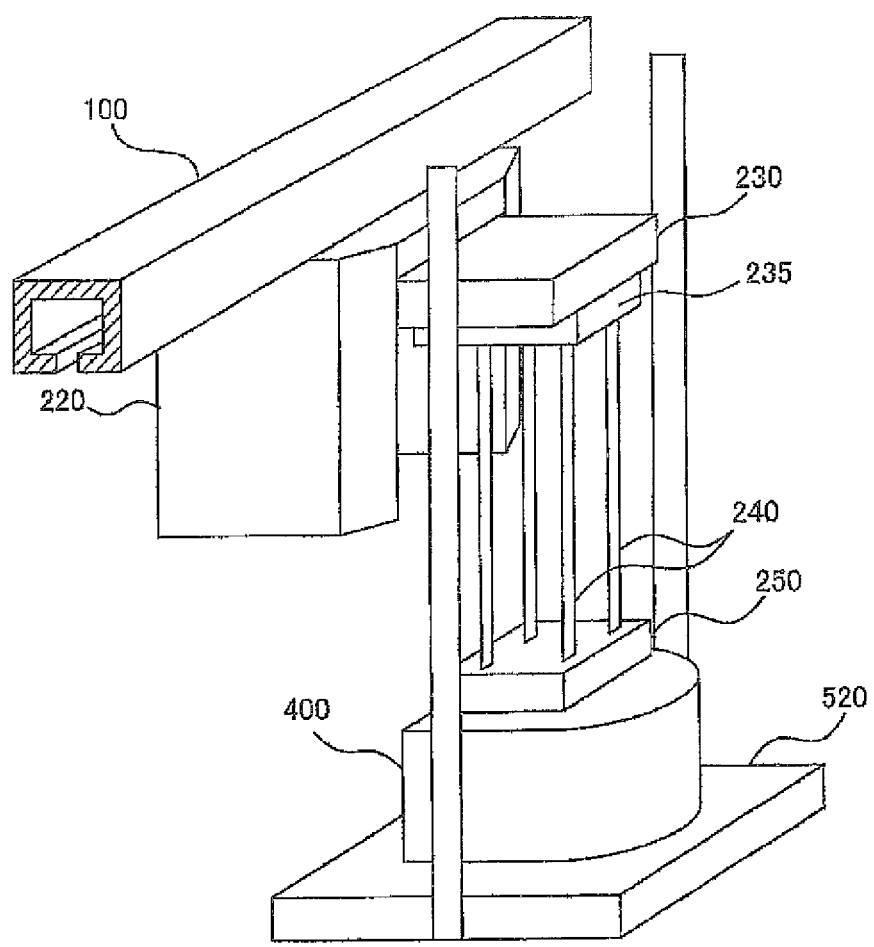
FIG. 4 is a perspective view showing a lateral transferring operation of a vehicle.

Next, a method of transferring the FOUP by the vehicle will be explained, referring to FIG. 3 and FIG. 4. FIG. 3 and FIG. 4 are perspective views showing the method of transferring the FOUP by the vehicle according to the embodiment.

In FIG. 3, a FOUP 400 is arranged on a port 510 just under the rail 100. In this case, the vehicle 200 first travels on the rail 100 and stops over the FOUP 400 arranged on the port 510.

Next, as shown in FIG. 3, the hoisting unit 235 winds off the hoisting belts 240 and the gripping unit 250 descends to the position of the FOUP 400. Then, a fine adjustment of the positions of the gripping unit 250 and the FOUP 400 is performed and the FOUP 400 is gripped.

When the FOUP 400 is gripped, the hoisting belts 240 are reeled and the FOUP 400 gripped by the gripping unit 250 ascends to the position of the main body member 220. Then, the vehicle 200 again travels on the rail 100 and conveys the FOUP 400.

In FIG. 4, the FOUP 400 is arranged at a side buffer 520 at the side of the rail 100. In this case, the moving unit 230 first moves to the side of the rail 100. Then, the hoisting belts 240 are wound off by the hoisting unit 235 and the gripping unit 250 descends to the position of the FOUP 400. By operating this way, a lateral transfer of the FOUP 400 from the rail 100 can be performed.

Figure 5:
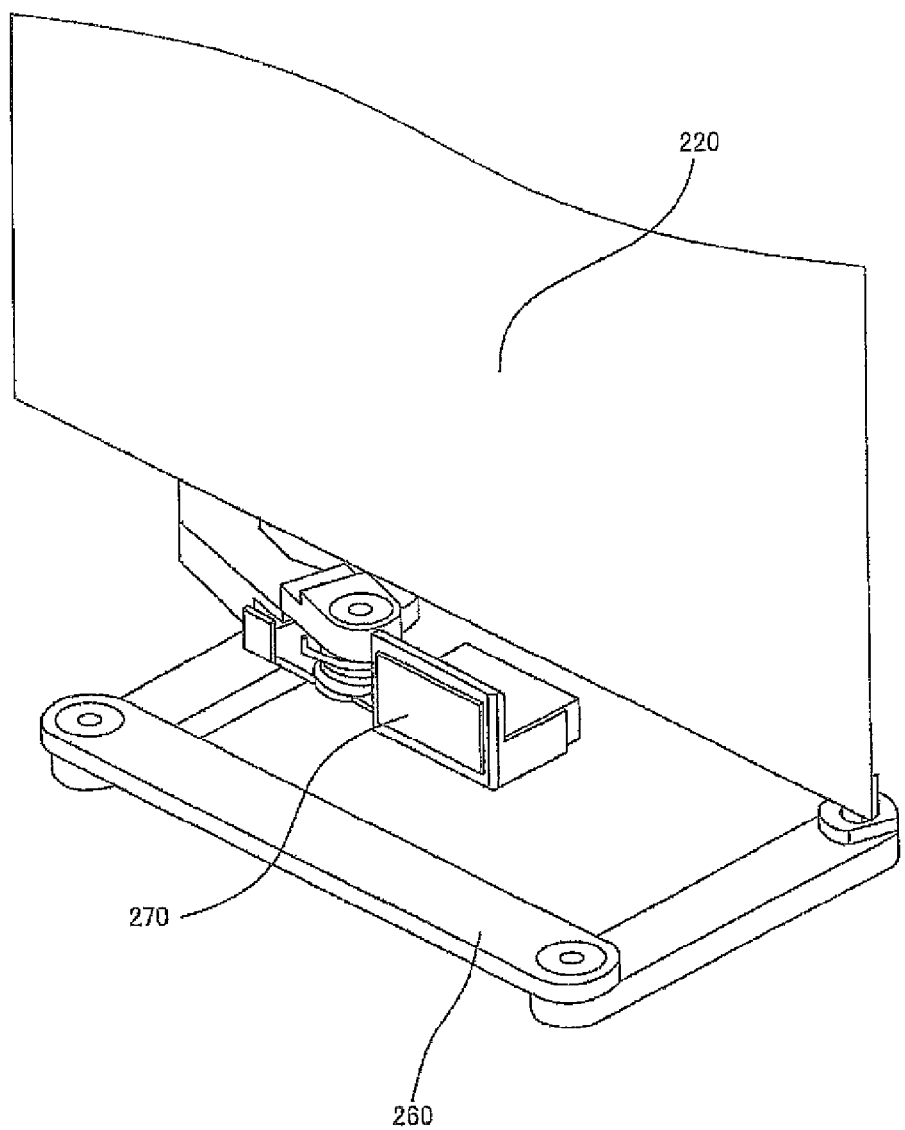
FIG. 5 is a perspective view showing structures of a falling prevention member and a swing inhibiting member.

Next, the concrete structures and operations of the falling prevention member 260 and the swing inhibiting member 270 will be explained in detail, referring to FIG. 5 through FIG. 10. FIG. 5 is a perspective view showing the structures of the falling prevention member and the swing inhibiting member. In addition, FIG. 6 through FIG. 9 are bottom views showing the operations of the falling prevention member and the swing inhibiting member when they are projected. FIG. 10 is a plan view showing the concrete structure of the biasing member.

In FIG. 5, the falling prevention member 260 and the swing inhibiting member 270 are arranged at the lower end side of the main body member 220. The falling prevention member 260 is configured to project to the position where the carried FOUP 400 can be supported from the lower side of the FOUP 400 when the FOUP 400 is carried. The swing inhibiting member 270 is configured to project to the position where the side surface of the carried FOUP 400 can be pushed when the FOUP 400 is carried. It should be noted that the falling prevention member 260 and the swing inhibiting member 270 are rotated by driving force provided from motors, which are not shown in the figure, and etc.

Figure 6:
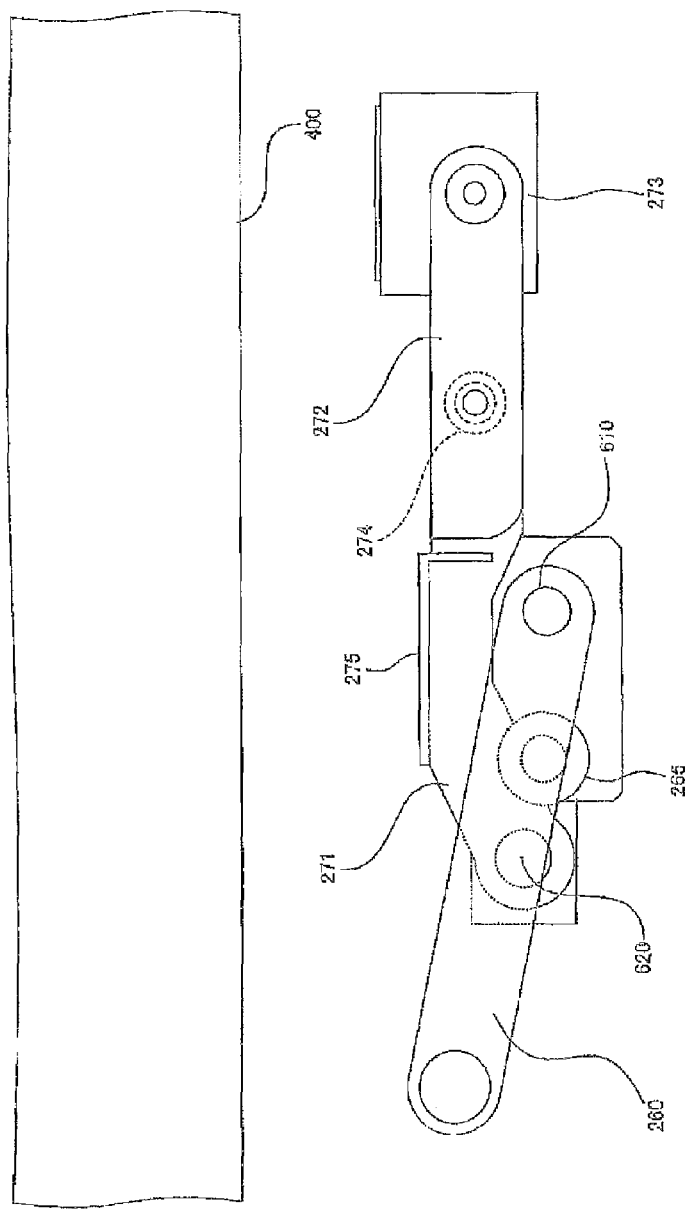
FIG. 6 is a bottom view showing operations of a falling prevention member and a swing inhibiting member when they are projected (Part 1).

FIG. 6, the falling prevention member 260 is attached to the main body member 220 so as to rotate horizontally about a rotation axis 610. On the other hand, the swing inhibiting member 270 is attached to the main body member 220 so as to rotate horizontally about a rotation axis 620. The swing inhibiting member 270 includes a first lever member 271, a second lever member 272, a pushing member 273, and a biasing member 274.

More specifically, a base end side of the first lever member 271 is pivotally supported by the main body member 220. A base end side of the second lever member 272 is pivotally supported by a tip of the first lever member 271. The pushing member 273 is pivotally supported by a tip of the second lever member 272. The biasing member 274 is attached to the part where the first lever member 271 and the second lever member 272 are connected, for example, a center of the axis that pivotally supports them. The biasing member 274 is, for example, a torsional spring, a plate spring, and etc. It should be noted that the biasing member 274 is configured to apply a biasing force to the first lever member 271 and the second lever member 272 so as to align the first lever member 271 and the second lever member 272 in line.

A roller 265 as one example of "a projecting unit" of the present invention is attached to the falling prevention member 260. A roller guide 275 as one example of "a force receiving guide" of the present invention is attached to the first lever member 271 in the swing inhibiting member 270. The roller guide 275 is in a form of a metal plate. The roller guide 275 is arranged at the position where the roller 265 abuts the roller guide 275 when the falling prevention member 260 projects. When the FOUP 400 is transferred to the vehicle 200, the falling prevention member 260 and the swing inhibiting member 270 are refracted so as not to project to the FOUP 400 in order not to interfere with the transfer of the FOUP 400 to the vehicle 200 (See FIG. 6).

Figure 7:
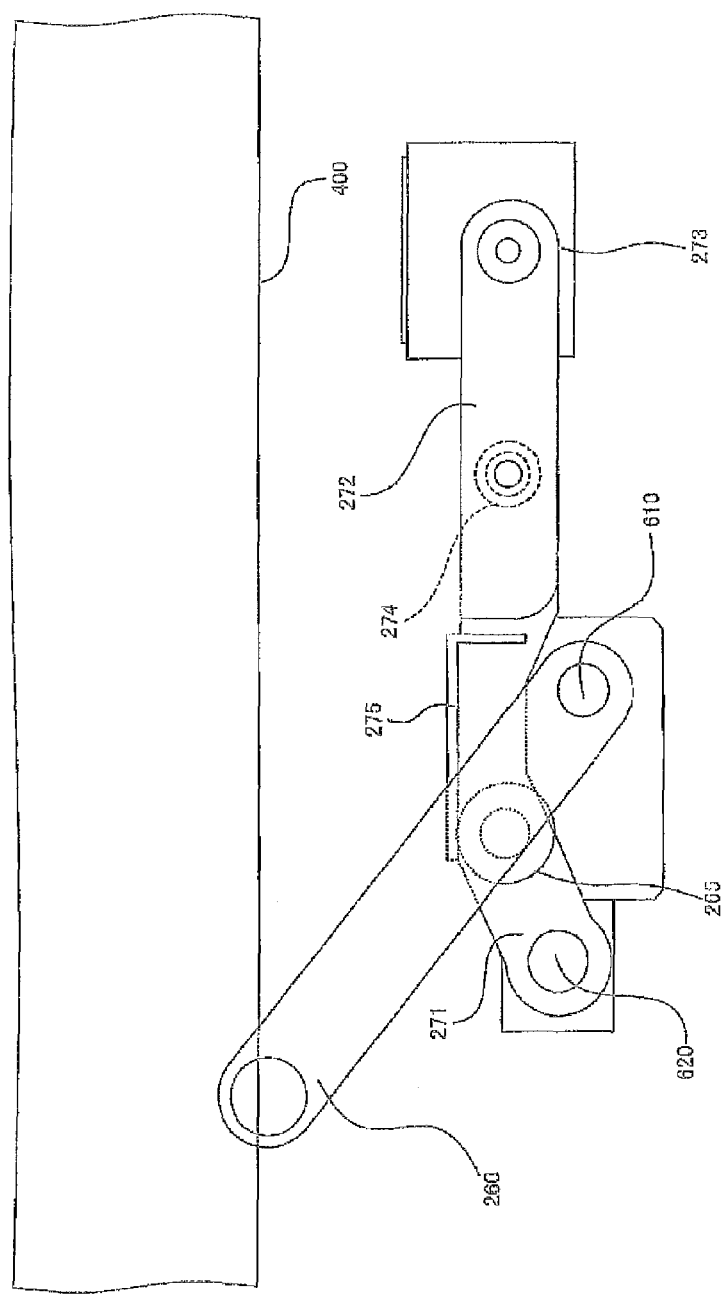
FIG. 7 is a bottom view showing operations of a falling prevention member and a swing inhibiting member when they are projected (Part 2).

As shown in FIG. 7, when the FOUP 400 is transferred, the falling prevention member 260 rotates. As the falling prevention member 260 rotates toward the FOUP 400, the roller 265 abuts the roller guide 275. After the roller 265 abuts the roller guide 275, the roller 265 pushes the roller guide 275, and the first lever member 271 of the swing inhibiting member 270 rotates. Thus, the falling prevention member 260 and the swing inhibiting member 270 project together.

Figure 8:
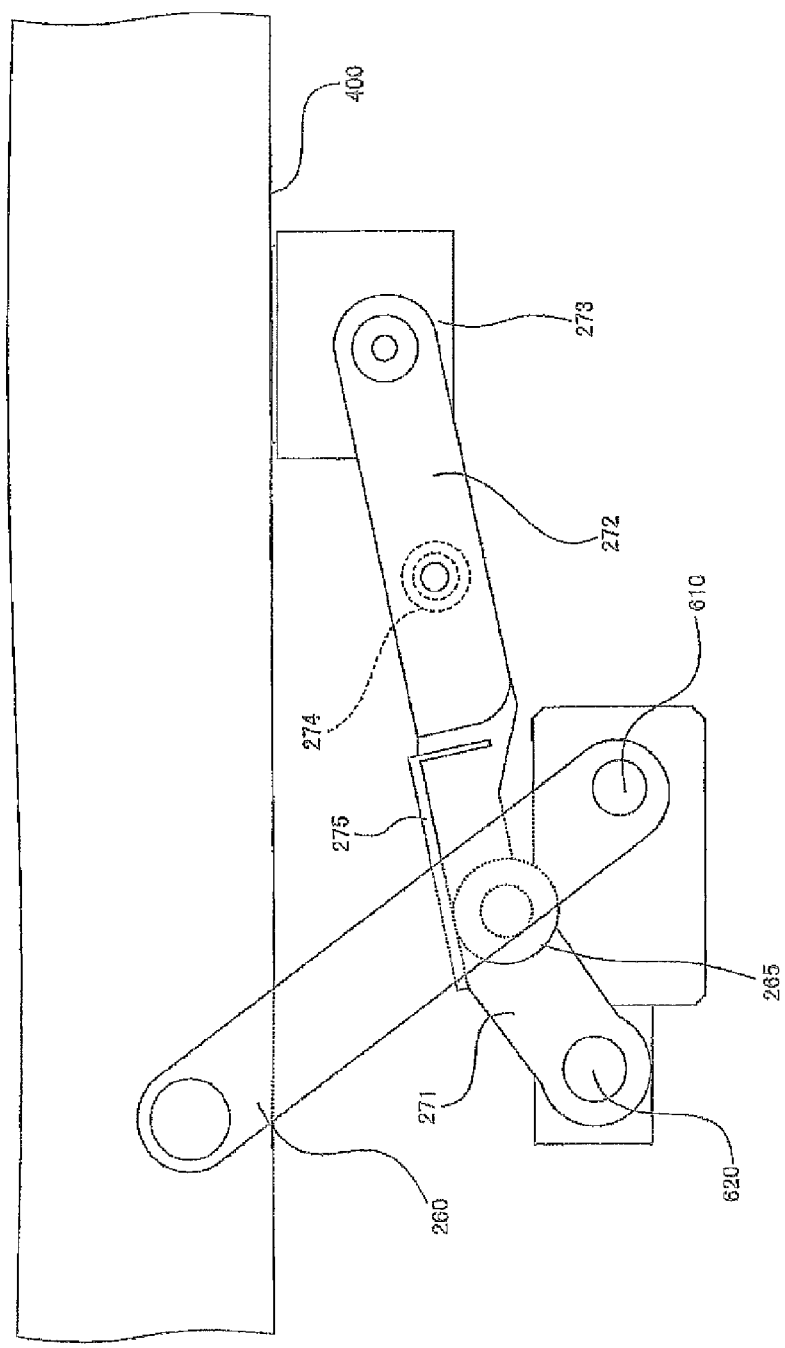
FIG. 8 is a bottom view showing operations of a falling prevention member and a swing inhibiting member when they are projected (Part 3).

As shown in FIG. 8, in the swing inhibiting member 270, the pushing surface of the pushing member 273 projects to the position where the pushing surface abuts the side surface of the FOUP 400 when the first lever member 271 rotates. At the stage of FIG. 8, the biasing force by the biasing member 274 is not generated because the positional relationship between the first lever member 271 and the second lever member 272 is the relationship where they are aligned in line.

Figure 9:
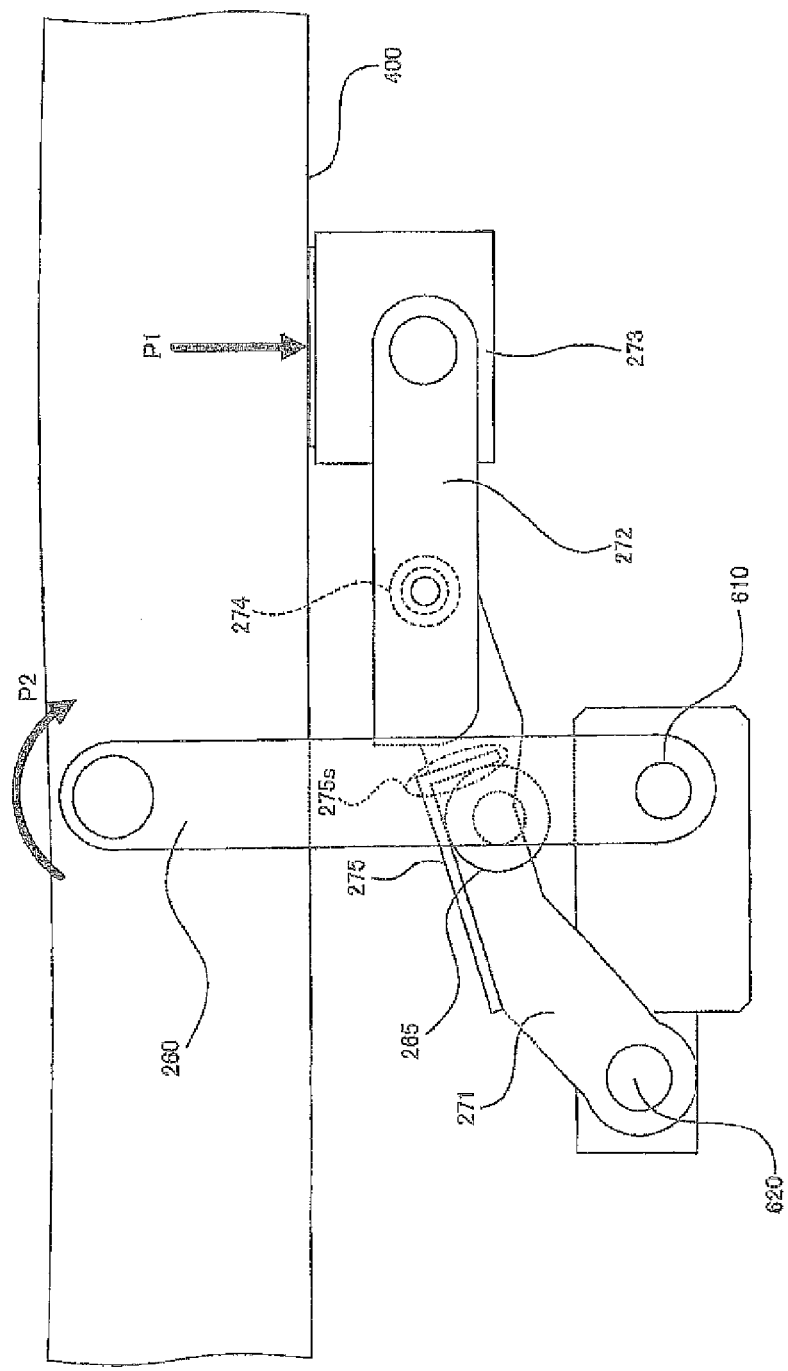
FIG. 9 is a bottom view showing operations of a falling prevention member and a swing inhibiting member when they are projected (Part 4).
Figure 10:
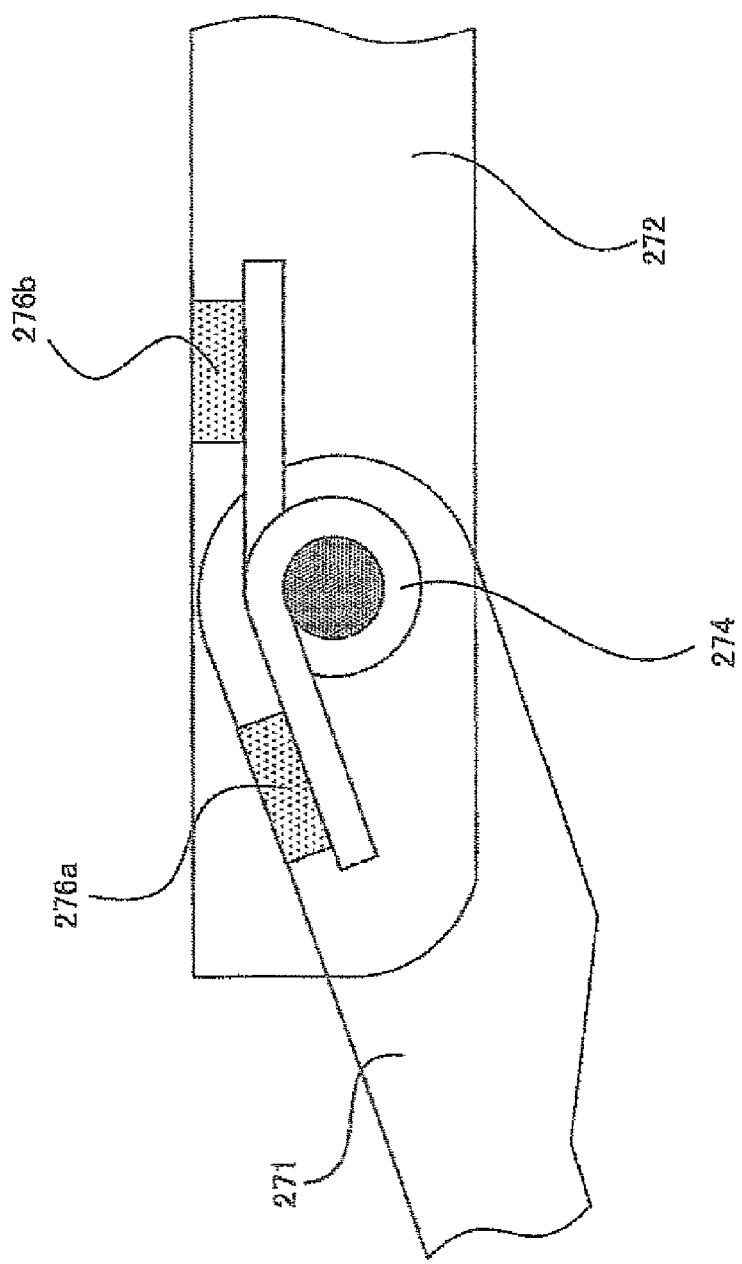
FIG. 10 is a plan view showing a concrete structure of a biasing member.

As shown in FIG. 9, when the first lever member 271 further rotates even after the pushing surface of the pushing member 273 abuts the side surface of the FOUP 400, the second lever member 272 bends relative to the first lever member 271. In this state, the biasing member 274 generates the biasing force that aligns the first lever member 271 and the second lever member 272 in line. In other words, the force to bias the second lever member 272 toward the FOUP is applied to the second lever member 272. Thus, the pushing member 273 pushes the FOUP 400 while the pushing member 273 follows the FOUP 400. Therefore, this swing inhibiting member 270 can inhibit the swing of the FOUP 400 more effectively than the case where only a rotating force of the first lever member 271 pushes the FOUP 400.

It should be noted that a force shown with an arrow P1 in FIG. 9 is applied to the pushing member 273 from the side surface of the FOUP 400. In this case, it may happen that the falling prevention member 260 rotates in a direction shown with an arrow P2 in the figure, with the rotation axis 610 being the axis for this rotation. However, since the rotating roller 265 abuts a stopper 275s of the roller guide 275, the falling prevention member 260 does not rotate in the direction shown with the arrow P2 in FIG. 9. In other words, the above-described mechanism with which the pushing member 273 does not move even if pushed by the FOUP 400 can keep the falling prevention member 260 in an appropriate position. Specifically, only a rotating force from a motor, not an external force, can move the falling prevention member 260 and the falling prevention member 260 can stay in the appropriate position without a brake and etc.

In FIG. 10, one end of the biasing member 274, which is a torsional spring, is attached to the first lever member 271 via a buffering material 276a. Another end of the biasing member 274 is attached to the second lever member 272 via a buffering material 276b. These buffering materials 276a and 276b can damp rapidly the swing transmitted from the FOUP 400. It should be noted that the same effect can be obtained even when an other member such as a plane spring is used as the biasing member 274. It is shown here that the buffering materials 276a and 276b are directly attached to the first lever member 271 and the second lever member 272, respectively. Instead, it is acceptable that receiving members, connection members, or etc. are arranged to the first lever member 271 and the second lever member 272 and the buffering members 276a and 276b are attached to the receiving members, the connection members, or etc.

Figure 11:
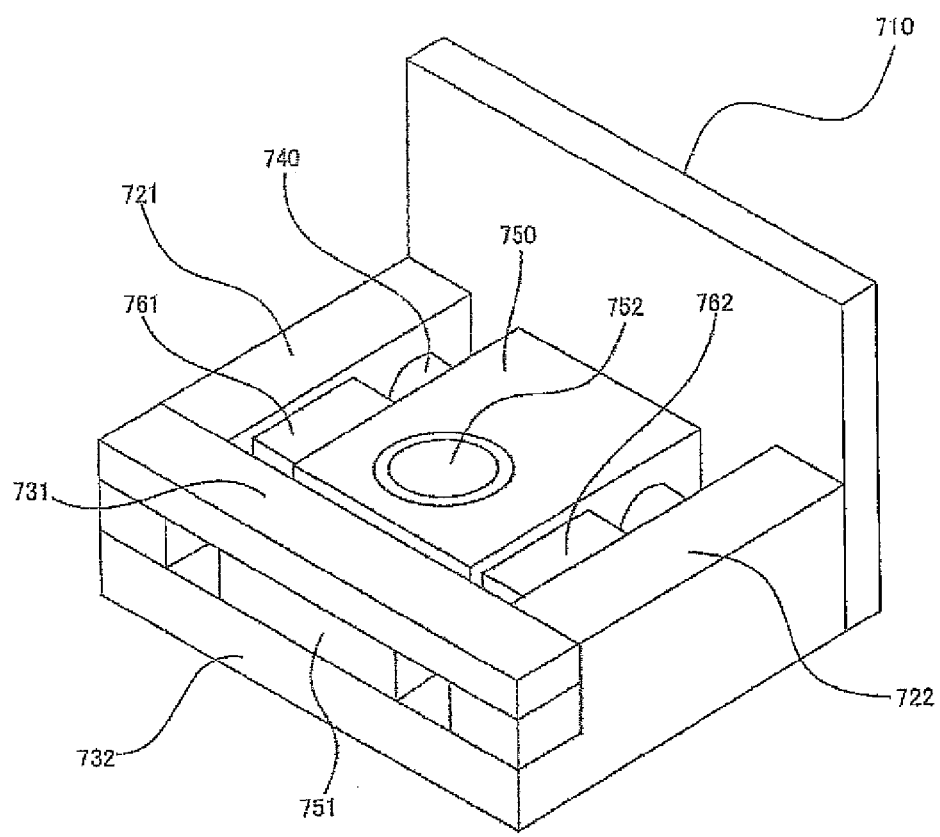
FIG. 11 is a perspective view showing a structure of a pushing member of a swing inhibiting member.
Figure 12:
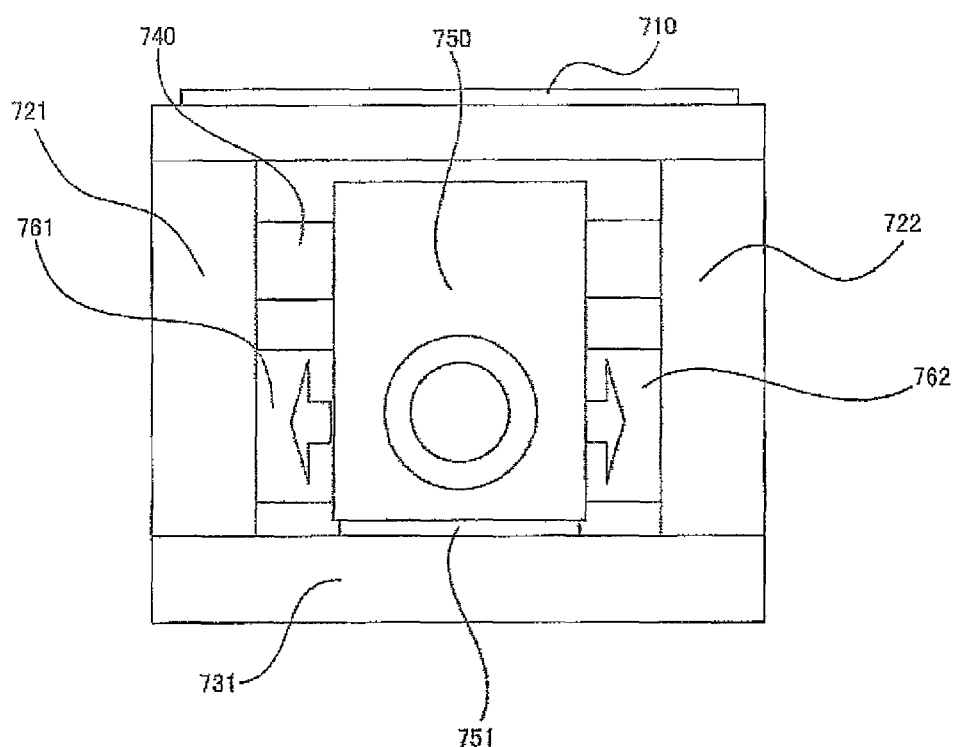
FIG. 12 is a plan view showing a structure of a pushing member of a swing inhibiting member.

Next, the concrete structure of the pushing member 273 of the above-described swing inhibiting member 270 will be explained, referring to FIG. 11 and FIG. 12. FIG. 11 is a perspective view showing the structure of the pushing member of the swing inhibiting member. FIG. 12 is a plan view showing the structure of the pushing member of the swing inhibiting member.

In FIG. 11, an elastic body (not shown in the figure) is attached to the pushing surface of a pushing surface member 710 of the pushing member 273 that abuts the FOUP 400. Thus, the pushing surface member 710 can push elastically the FOUP 400. A first longitudinal member 721 and a second longitudinal member 722 are attached to the side opposite to the pushing surface of the pushing surface member 710. If a part of the first longitudinal member or the second longitudinal member where the pushing surface member 710 is attached is called a base end part, the first longitudinal member 721 and the second longitudinal member 722 are attached to the pushing surface member 710 at their base end parts. On the other hand, if the side opposite to the base end part of the first longitudinal member 721 or the second longitudinal member 722 is called a tip part, A first lateral member 731 and a second lateral member 732 are attached to the tip side of the first longitudinal member 721 and the tip side of the second longitudinal member 722. In other words, the first lateral member 731 and the second lateral member 732 connects the tip part of the first longitudinal member 721 and the tip part of the second longitudinal member 722 with each other. In addition, a shaft 740 is arranged between the first longitudinal member 721 and the second longitudinal member 722. The shaft 740 is attached to the first longitudinal member 721 and the second longitudinal member 722.

The shaft 740 inserts a block member 750 arranged in a gap between the first longitudinal member 721 and the second longitudinal member 722. In more detail, a through hole (not shown in the figure) is formed in the block member 750 and the shaft 740 is inserted into this through hole. Thus, the block member 750 can slide in a longitudinal direction of the shaft. In addition, a projecting plate portion 751 that projects in a direction away from the pushing surface member 710 is formed in the block member 750. The projecting plate portion 751 is arranged in a gap formed between the first lateral member 731 and the second lateral member 732 so as to slide along this gap. Thus, the shaft 740 and the slide mechanism that is formed by the first lateral member 731 and the second lateral member 732 can prevent the block member 750 from moving in a direction other than the direction in which the block member 750 should slide. Thus, the damage of the block member 750 can be avoided. It should be noted that the block member 750 is one example of "a main body member" of the present invention and is attached to the tip of the second lever member 272 via a connecting unit 752 (See FIG. 6 though FIG. 9). The block member 750 is typically made of a metal, etc. It should be noted that the block member 750 may be made of a resin with lower friction coefficient, etc. In this case, it is possible to omit a bush, etc.

As shown in FIG. 11 and FIG. 12, a first elastic body 761 is arranged in a gap between the block member 750 and the first longitudinal member 721. The first elastic body 761 is stuck to the first longitudinal member 721, and not to the block member 750. On the other hand, a second elastic body 762 is arranged in a gap between the block member 750 and the second longitudinal member 722. The second elastic body 762 is stuck to the second longitudinal member 722, and not to the block member 750. The first elastic body 761 and the second elastic body 762 is made of, for example, rubber, sponge, a gel material, or etc. However, the material for the first elastic body 761 and the second elastic body 762 is not limited to the above. It is acceptable they are, for example, metal elastic bodies such as coil springs, etc. A pair of these elastic bodies 761 and 762 can also slide elastically the block member 750.

The above-described pushing member 273 can prevent the vibration transmitted from the second lever member 272 from transmitting to the pushing surface member 710. More specifically, the pushing member 273 can prevent the vibration generated in the travelling unit 210 and transmitted from the conveying unit 220 from transmitting to the pushing surface member 710.

As described above, since the overhead transport vehicle according to this embodiment comprises the swing inhibiting member 270, it is possible to inhibit effectively the transmission of the vibration and the swing of the FOUP 400.

The present invention is not limited to the above-described embodiment and can be arbitrarily changed without departing from the scope or concept of the invention that can be read from the claims and the entire specification. The conveying system including such change is also within the scope of the invention.

INDUSTRIAL APPLICABILITY

The present invention is broadly applied to an overhead transport vehicle.

The invention claimed is:
1. A overhead transport vehicle comprising:
a travelling unit configured to travel on a rail arranged on or near a ceiling;

a conveying unit attached to the travelling unit, the conveying unit configured to move an article into a containing space and convey the article;

a swing inhibiting member pivotally supported by the conveying unit, the swing inhibiting member configured to move between a pushing position and a retracting position, the pushing position being where a side surface of the article is pushed, and the retracting position being away from the pushing position so as to move the article into the containing space;

the swing inhibiting member including:
   a pushing member configured to push the side surface of the article;
   a lever member having a first end side and a second end side, the first end side configured to support the pushing member, and the second end side pivotally supported by the conveying unit; and
   a biasing member arranged in the lever member, the biasing member configured to bias the pushing member toward the article;
   the pushing member including:
      a main body member pivotally supported by the lever member;
      a slide member including a pushing surface to abut the article, the slide member supported by the main body member and configured to slide in a slide direction crossing a travelling direction; and
      elastic bodies arranged between the main body member and the slide member, the elastic bodies configured to elastically slide the slide member.

2. The overhead transport vehicle according to claim 1, wherein
the main body member is formed in a block shape, the main body member including a planar projecting plate portion, the planar projecting plate portion projecting away from the pushing surface;
the slide member further includes:
   first and second longitudinal members abutting the pushing surface and disposed at both sides of the main body member with predetermined gaps from the main body member, respectively;
   a lateral member connecting the first and second longitudinal members, and the lateral member configured to:
      support the projecting plate portion,
      slide the projecting plate portion in the slide direction, and
      prevent movement of the projecting plate portion in the upward and downward directions; and
   a shaft member inserted into a through hole formed in the main body member, the shaft member configured to:
      slide relative to the main body member, and
      connect the first and second longitudinal members with each other at a place between the pushing surface and the lateral member; and
wherein the elastic bodies are arranged in the predetermined gap between the main body member and the first longitudinal member and in the predetermined gap between the main body member and the second longitudinal member.

3. The overhead transport vehicle according to claim 1, wherein the lever member includes a first lever member and a second lever member;

wherein a first end side of the first lever member is pivotally supported by the conveying unit, a first end side of the second lever member is pivotally supported by a second end side of the first lever member, and a second end side of the second lever member pivotally supports the pushing member;

the biasing member is arranged at a place where the first lever member and the second lever member are connected with each other, and the biasing member is further configured to bias the second lever member, and align the first lever member and the second lever member in line; and the lever member further includes a driving force transmitting unit, the driving force transmitting unit configured to transmit a rotating force that rotates the first lever member towards the article.

4. The overhead transport vehicle according to claim 3 further comprising:
a falling prevention member pivotally supported by the conveying unit under the swing inhibiting member to rotate, the falling prevention member configured to prevent the article from falling from the containing space by projecting under the article in conjunction with a movement of the swing inhibiting member when the swing inhibiting member moves from the retracting position to the pushing position;
the driving force transmitting unit including a projecting member and a force receiving guide, the projecting member provided on the falling prevention member, the force receiving guide provided on the first lever member, and the force receiving guide configured to receive a force from the projecting member.

5. The overhead transport vehicle according to claim 3, wherein
the biasing member is a torsional spring;
a first end side of the torsional spring is attached to the first lever member; and
a second end side of the torsional spring is attached to the second lever member.

6. The overhead transport vehicle according to claim 5, wherein
the first end side of the torsional spring abuts the first lever member via a first buffering member; and
the second end side of the torsional spring abuts the second lever member via a second buffering member.

7. The overhead transport vehicle according to claim 3, wherein
the biasing member is a plate spring;
a first end side of the plate spring is configured to abut the first lever member; and
a second end side of the plate spring is configured to abut the second lever member.

8. The overhead transport vehicle according to claim 7, wherein
the first end side of the plate spring abuts the first lever member via a buffering member; and
the second end side of the plate spring abuts the second lever member via a buffering member.

9. The overhead transport vehicle according to claim 1, wherein the pushing member includes a third elastic body attached on at least one part of the pushing surface.

* * * * *